United States Patent [19]

Robb

[11] Patent Number: 4,601,778
[45] Date of Patent: Jul. 22, 1986

[54] MASKLESS ETCHING OF POLYSILICON
[75] Inventor: Francine Y. Robb, Tempe, Ariz.
[73] Assignee: Motorola, Inc., Schaumburg, Ill.
[21] Appl. No.: 705,161
[22] Filed: Feb. 25, 1985
[51] Int. Cl.⁴ .................. H01L 21/306; B44C 1/22; C03C 15/00; C03C 25/06
[52] U.S. Cl. .................. 156/628; 156/643; 156/646; 156/657; 156/662; 204/192 E
[58] Field of Search .......... 29/576 B, 580; 148/1.5, 148/187; 156/628, 643, 646, 657, 662; 250/492.2, 492.3; 204/192 E

[56] References Cited
U.S. PATENT DOCUMENTS

| | | | |
|---|---|---|---|
| 4,069,096 | 1/1978 | Reinberg et al. | 156/646 X |
| 4,267,011 | 5/1981 | Shibata et al. | 156/628 |
| 4,377,437 | 3/1983 | Taylor et al. | 156/628 |
| 4,377,734 | 3/1983 | Mashiko et al. | 156/628 X |
| 4,383,885 | 5/1983 | Maydan et al. | 156/646 X |
| 4,438,556 | 3/1984 | Komatsu et al. | 156/643 X |
| 4,504,574 | 3/1985 | Meyer et al. | 156/628 X |

Primary Examiner—William A. Powell
Attorney, Agent, or Firm—Jonathan P. Meyer

[57] ABSTRACT

Maskless etching of polysilicon is accomplished by exposing portions of a polysilicon surface to ion bombardment. Bombardment by oxygen or hydrogen ions is effective to reduce the etch rate of polysilicon in a chlorine-containing plasma. Therefore, patterned ion bombardment prior to etching in a chlorine plasma is effective to pattern the polysilicon surface.

2 Claims, 3 Drawing Figures

MASKLESS ETCHING OF POLYSILICON

FIELD OF THE INVENTION

The present invention relates, in general, to the etching of polysilicon without the use of an etch mask. More particularly, the invention relates to a method of treating polysilicon films to produce portions of the films which have a lower etch rate than untreated portions of the films.

BACKGROUND OF THE INVENTION

Polysilicon films have come into increasing use in the semiconductor industry. Such films are used, for instance, as the gate conductor in MOS devices. Of course, the use of any film in the manufacture of integrated circuits requires a method etching the film. It is widely known that chlorine or chlorine/fluorocarbon plasmas will etch polysilicon. However, in order that portions of the polysilicon film will not be removed it is necessary to protect those portions with an etch mask. Typically, this etch mask takes the form of a patterned photoresist. Obviously, the need to deposit, pattern and strip an etch mask adds significantly to the cost of etching a film.

SUMMARY OF THE INVENTION

Accordingly, it is an object of the present invention to provide an improved method of etching polysilicon films.

It is a further object of the present invention to provide a method of etching polysilicon films which does not require the use of an etch mask.

These and other objects and advantages of the present invention are provided by treating portions of polysilicon film by ion bombardment and then exposing the entire polysilicon film to a polysilicon etchant. Those portions of the polysilicon which have been left untreated are found to etch preferentially with respect to the treated portions of the film. Thus, it is possible to etch a pattern in a polysilicon film without the use of an etch mask.

These and other objects and advantages of the present invention will be apparent to one skilled in the art from the detailed description below taken together with the drawings.

DETAILED DESCRIPTION OF THE INVENTION

Figure 1:
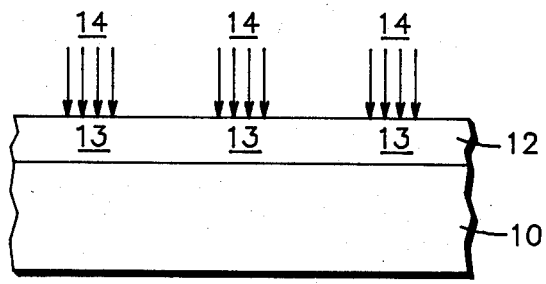
FIG. 1 is a cross-sectional view of a substrate and polysilicon film illustrating a step in the process of the present invention.
Figure 2:
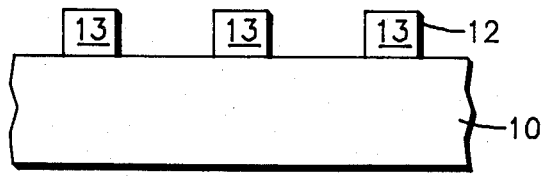
FIG. 2 is a cross-sectional view of a substrate and polysilicon film illustrating another step in the process of the present invention.

FIGS. 1 and 2 illustrate, in cross-sectional view, the processing of a polysilicon film 12 on substrate 10 according to the principles of the present invention. A very common process in which it is necessary to finely etch polysilicon films is the manufacture of polysilicon gate MOS devices. In this and other examples of he use of polysilicon films, the actual structure would probably be somewhat more complicated than than shown in FIGS. 1 and 2. However, these complexities would not alter the principles of the present invention. FIG. 1 illustrates a polysilicon film 12 overlying a substrate 10. Many methods of depositing a polysilicon film on a substrate, such as chemical vapor deposition, are known and will not be detailed here.

For whatever reason, it is desired to pattern polysilicon film 12 by leaving portions 13 on substrate 10 and removing the remainder. The first step in producing this result according to the present invention is to treat portions 13 of polysilicon film 12 by ion bombardment. Ions striking portions 13 of polysilicon film 12 are generally indicated by arrows 14.

As will be apparent to one skilled in the art, two techniques immediately suggest themselves as suitable for selectively treating a polysilicon film by ion bombardment. The first, which may be generally referred to as a direct-write technique, involves the use of a finely focused ion beam having a diameter smaller than the smallest feature of the structure to be defined. The beam is scanned across the surface of the polysilicon film in a manner similar to the electron beam of a cathode ray tube. The desired exposure differential between those areas of the polysilicon film to be removed and those to be left may be achieved either by modulating the intensity of the ion beam as the entire surface is scanned or by directing the ion beam to expose only those areas of the polysilicon film which are to be removed. The other technique which would be suitable, and which may be referred to as a projection technique, involves the use of a relatively wide collimated beam of ions to expose the polysilicon film through a mask which protects certain areas of the film from exposure. This process may be carried out by exposing the entire wafer at one time through a mask which contains masks for many individual die or by the use of stepper, which exposes each die on the wafer individually in a serial fashion.

FIG. 2 illustrates the result of the second step in the processing of a polysilicon film 12 according to the principles of the present invention. The entirety of polysilicon film 12 on substrate 10 has been exposed to a polysilicon etchant. Portions 13 of polysilicon film 12 have been substantially uneffected by the action of the polysilicon etchant, while the raminder of film 12 has been removed exposing substrate 10. This selective removal of polysilicon is a result of a differential etch rate between those portions exposed to ion bombardment and those portions not so exposed.

Figure 3:
FIG. 3 is a flow chart illustrating the steps in the process of the present invention.

FIG. 3 is a flow chart illustrating the steps in the processing of a polysilicon film according to the principles of the present invention. The first step in the process is to treat portions of the polysilicon film to be removed by means of ion bombardment. Particular examples of suitable treatments are given below. The second step in the process is to expose the entire polysilicon layer both the treated and untreated portions, to polysilicon etchant. Again, a particular example of suitable etchant is given below. The process described requires no masking layers overlying the polysilicon film during the polysilicon etch.

EXAMPLE 1

The treatment of the polysilicon film according to this example involves the exposure of those portions of the film to be left after the etch to a hydrogen plasma at 150 microns pressure for approximately 20 minutes. The treatment is performed in a donut-type reactor with the wafers placed on a cathode covered with polyimide.

Radio frequency energy at a frequency of 13.56 MHz 250 watts of power is applied. A flow rate of 36 SCCM of H is used. After treatment, the polysilicon film is etched in a chlorine plasma. The particular etching machine used is available from the Perkin Elmer Corporation and is designated the Cornerstone model. In this particular configuration a graphite top electrode is used. The pressure is maintained at 800 microns and the chlorine flow rate is 100 SCCM. This particular etcher utilizes a 200 kilohertz power supply to generate the plasma. It has been found that the untreated portions of the polysilicon film exposed as described above etch approximately 1.3 times as fast as those portions which were exposed to the ion bombardment treatment.

EXAMPLE 2

In this example the ion bombardment treatment is carried out in a reactor available from the Applied Materials Corporation and designated the AME 8110 model. In this case the treatment is with an oxygen plasma at a pressure of five microns for a period of 14 minutes. The flow rate of oxygen is 20 SCCM and the power applied is 800 watts. The etch process according to this example is identical to that described above for example 1. It is found that the untreated portions of the polysilicon film etch approximately 1.8 times as fast as the treated portions of the film.

With regard to the length of time necessary for the ion bombardment treatment, the following information has been obtained. This information applies to the process described above with regard to example 2. One minute of exposure to the ion bombardment treatment changed the initial (i.e. less than 10 seconds) etch rate from 85 Angstroms per second to 55 Angstroms per second and changed the terminal (i.e. greater than 10 seconds total etch time) etch rate from 93 Angstroms per second to 77 Angstroms per second. With seven minutes of exposure to the ion bombardment treatment, the initial etch rate was 44 Angstroms per second and the terminal etch rate was 74 Angstroms per second. After 14 minutes of exposure to the ion bombardment the initial etch rate was 33 Angstroms per second and the terminal etch rate was 70 Angstroms per second.

As will be apparent to one skilled in the art from the above, an improved method of etching polysilicon film has been disclosed. The process according to the present invention provides a method of etching polysilicon films to define patterns therein which does not require the presence of an etch mask overlying the polysilicon film during the etch process. The process according to the present invention provides the potential of a significantly less costly method of etching polysilicon films.

I claim:

1. A method of etching polysilicon comprising the steps of:
   exposing a portion of a polysilicon film to at least one of an oxygen plasma and a hydrogen plasma; and
   exposing both treated and untreated portions of said polysilicon film to a polysilicon etchant.

2. A method according to claim 1 wherein said polysilicon etchant further comprises:
   a chlorine-containing plasma.

* * * * *